United States Patent [19]
Andrews

[11] Patent Number: 5,357,536
[45] Date of Patent: Oct. 18, 1994

[54] METHOD AND APPARATUS FOR THE POSITIONING OF LASER DIODES

[75] Inventor: John R. Andrews, Fairport, N.Y.

[73] Assignee: Xerox Corporation, Stamford, Conn.

[21] Appl. No.: 57,797

[22] Filed: May 7, 1993

[51] Int. Cl.$^5$ .............................................. H01S 3/19
[52] U.S. Cl. ........................................ 372/50; 372/23; 372/36; 372/97; 372/107
[58] Field of Search ....................... 372/50, 36, 97, 23, 372/107

[56] References Cited

U.S. PATENT DOCUMENTS

| | | | |
|---|---|---|---|
| 4,393,387 | 7/1983 | Kitamura | 346/108 |
| 4,404,571 | 9/1983 | Kitamura | 346/108 |
| 4,420,761 | 12/1983 | Kitamura | 346/108 |
| 4,474,422 | 10/1984 | Kitamura | 350/68 |
| 4,690,391 | 9/1987 | Stoffel et al. | 269/21 |
| 4,712,018 | 12/1987 | Stoffel et al. | 250/578 |
| 4,881,237 | 11/1989 | Donnelly | 372/50 |
| 4,914,667 | 4/1990 | Blander et al. | 372/44 |
| 4,999,077 | 3/1991 | Drake et al. | 156/299 |
| 5,157,680 | 10/1992 | Goto | 372/50 |

Primary Examiner—Georgia Y. Epps
Attorney, Agent, or Firm—Duane C. Basch

[57] ABSTRACT

The present invention encompasses both a method and an apparatus for fabricating a multiple beam semiconductor laser array, wherein the laser includes a plurality of semiconductor laser dies affixed in a linear fashion to a supporting heatsink. Accurate alignment of the lasers and control of interlaser spacing is achieved through the use of alignment structures formed on the mounting surface of the heatsink. Once assembled, the alignment structures remain in an abutting relationship with the ridge waveguides present on each of the semiconductor lasers. The method not only enables the accurate placement of the laser diodes relative to one another so as to reduce interlaser spacing error, but also eliminates the need for multiple-step alignment operations to produce the multiple diode laser array.

26 Claims, 3 Drawing Sheets

METHOD AND APPARATUS FOR THE POSITIONING OF LASER DIODES

This invention relates generally to a semiconductor laser device, and more particularly to a method and apparatus for precisely fabricating a multiple diode laser array from semiconductor laser diodes.

CROSS REFERENCE

The following related applications are hereby incorporated by reference for their teachings:

U.S. patent application No. 08/057,798, U.S. Pat. No. 5,324,387 to John R. Andrews et al., entitled "Method of Fabricating Asymmetric Closely-spaced Multiple Diode Lasers" and filed concurrently herewith; and U.S. patent application No. 08/057/799, patent pending to John R. Andrews, entitled "Method of Fabricating Closely Spaced Dual Diode Lasers" and filed concurrently herewith.

BACKGROUND AND SUMMARY OF THE INVENTION

The present invention is directed to a method and apparatus for producing a multiple diode semiconductor laser array having accurate interlaser spacings on the order of less than 100 $\mu$m. Such an array may be incorporated in numerous devices including flying spot scanners (commonly referred to as raster output scanners (ROSs)). A flying spot scanner typically has a reflective multifaceted polygon mirror that is rotated about its central axis to repeatedly sweep one or more intensity modulated beams of light across a photosensitive recording medium in a linear or fast-scanning direction. Printers employing multiple intensity-modulated beams are referred to as multibeam or multispot printers. The multispot lasers are considered to be an enabling technology for high speed printers operating at resolutions of about 600 spots per inch (spi) or greater. The present invention includes multiple laser dies bonded to a heatsink in a linear array to provide the multibeam output capability for a ROS. Furthermore, the relative spacing between the laser emitting regions of the laser dies is accurately controlled by alignment means between the heatsink and the laser dies.

Heretofore, the desirability of a multiple beam semiconductor laser arrays has been recognized. Designs intended to achieve close spacing of the emitted laser beams are known, of which the following disclosures which may be relevant:

U.S. Pat. No. 4,393,387
Patentee: Kitamura
Issued: Jul. 12, 1983
U.S. Pat. No. 4,404,571
Patentee: Kitamura
Issued: Sep. 13, 1983
U.S. Pat. No. 4,420,761
Patentee: Kitamura
Issued: Dec. 13, 1983
U.S. Pat. No. 4,474,422
Patentee: Kitamura
Issued: Oct. 2, 1984
U.S. Pat. No. 4,690,391
Patentee: Stoffel et al.
Issued: Sep. 1, 1987
U.S. Pat. No. 4,712,018
Patentee: Stoffel et al.
Issued: Dec. 8, 1987
U.S. Pat. No. 4,914,667
Patentee: Blonder et al.
Issued: Apr. 3, 1990
U.S. Pat. No. 4,999,077
Patentee: Drake et al.
Issued: Mar. 12, 1991

The relevant portions of the foregoing patents, hereby incorporated by reference for their teachings, may be briefly summarized as follows:

U.S. Pat. No. 4,393,387 teaches a beam recording apparatus including a semiconductor array laser light source having a plurality of light beam emitting points, a condensing optical system, an image rotator, and a rotatable polygon mirror for deflecting the light beams to the surface of a photosensitive drum. High density recording is enabled by controlling the angle of incidence, and therefore the interbeam spacing, of the outermost beams at the surface of the photosensitive drum.

U.S. Pat. No. 4,404,571 describes a multibeam recording apparatus comprising a scanner for scanning a recording medium with a plurality of light beams and a beam detector. The scanner employs a laser array light source having a plural number of semiconductor lasers arranged in a row. The beam detector utilizes a screen plate with a detection aperture which is smaller than the inter-beam spacing to individually detect each of the plural beams.

U.S. Pat. No. 4,420,761 discloses a recording apparatus having plural dots arranged inclined to the scanning direction in order to increase the dot or scanning density. The phase difference caused by such inclination of a semiconductor laser array is compensated for using delay circuitry to generate a delay in the driving signals for the plural laser beams in accordance with the offset caused by the inclination.

U.S. Pat. No. 4,474,422 describes an optical scanning apparatus having a light source consisting of an array of aligned light sources. The beams from the light sources are collimated and deflected to sweep across a single photoreceptor. The beams are also displaced from each other in the cross-scan direction so that multiple lines can be scanned simultaneously across the photoreceptor. An object of U.S. Pat. No. 4,474,422 is to reduce variations in pitch by closely spacing individual lasers within the laser array in a compact structure.

U.S. Pat. No. 4,690,391 and U.S. Pat. No. 4,712,018 teach a method and apparatus, respectively, for the fabrication of long, full width arrays of reading or writing elements from a plurality of smaller arrays. An alignment tool, having array aligning formations thereon, is utilized to align the smaller arrays by having the aligning formations contact an array aligning formation present on the smaller array. The illustrated embodiment utilizes pins present on the surface of the alignment tool to mate with V-grooves on the smaller array.

U.S. Pat. No. 4,914,667 discloses a laser light source for use with optical communications. More specifically, the laser is a Bragg-reflector type laser which is aligned, via a V-groove etched in a supporting substrate, with an optical fiber. Vertical and lateral alignment is achieved by the selectively etched rail and groove features, while the remaining degree of freedom is used to abut the laser active portion against the Bragg-reflector portion.

U.S. Pat. No. 4,999,077 teaches a method of fabricating a coplanar array from a plurality of short scanning subunits for reading and writing images. Fabrication is accomplished using an alignment fixture having a patterned thick film layer on a surface thereof. The subunits, having correspondingly keyed strips on a surface thereof so that when placed in contact with the alignment fixture the subunits are maintained in an abutting relationship. Subsequently, the subunits are adhesively attached to a structural member which is placed in contact with an opposite surface, thereby forming a coplanar array.

An object of the present invention, therefore, is to enable the assembly of an array of individual semiconductor lasers, each of which may have different characteristics. For example, each of the lasers may have a different wavelength, polarization or other characteristic which makes it difficult to fabricate such an array monolithically.

In accordance with the present invention, there is provided a multiple diode laser array comprising: a heatsink, a plurality of laser diodes, each including a wafer having a series of epitaxially grown layers deposited upon a surface thereof to form an emitter, and a ridge-shaped waveguide defining the position of the emitter, and alignment means, disposed at preset intervals along a planar surface of said heatsink and adapted to associate with the waveguides of said plurality of laser diodes, for controlling the spacing of said laser diodes with respect to one another to assure accurate spacing of the emitters therein.

In accordance with another aspect of the present invention, there is provided a single diode laser including a wafer portion having a series of epitaxially grown layers deposited upon a surface thereof to form a p-n junction emitter and a waveguide present on the surface of the wafer to define the position of the emitter, the single diode laser being adapted to be assembled adjacent to like single diode lasers to provide a multiple diode array. The array further comprises a heatsink alignment means, disposed at along a planar surface of said heatsink, for controlling the location of said laser diodes, said alignment means being adapted to remain in an abutting relationship with the waveguides of the laser diodes so that a predetermined spacing between the emitters of adjacent laser diodes is accurately maintained, and means for permanently affixing the laser diodes to the heatsink.

In accordance with yet another aspect of the present invention, there is provided a method of fabricating an array of multiple diode lasers, each laser having a raised waveguide on a surface thereof which defines the location of light emitting regions thereon. The method comprising the steps of:

1) forming a plurality of parallel alignment structures on a surface of a heatsink, said alignment structures being spaced apart from one another while extending in a substantially parallel direction, thereby forming elongated recesses therebetween;

2) placing the lasers on said heatsink so that the lasers are maintained in a predetermined spaced-apart arrangement by an abutting contact region between a surface of the raised waveguide and a surface of the alignment structure; and 3) permanently affixing said laser diodes to said heatsink.

The present invention will be described in connection with various preferred embodiments, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
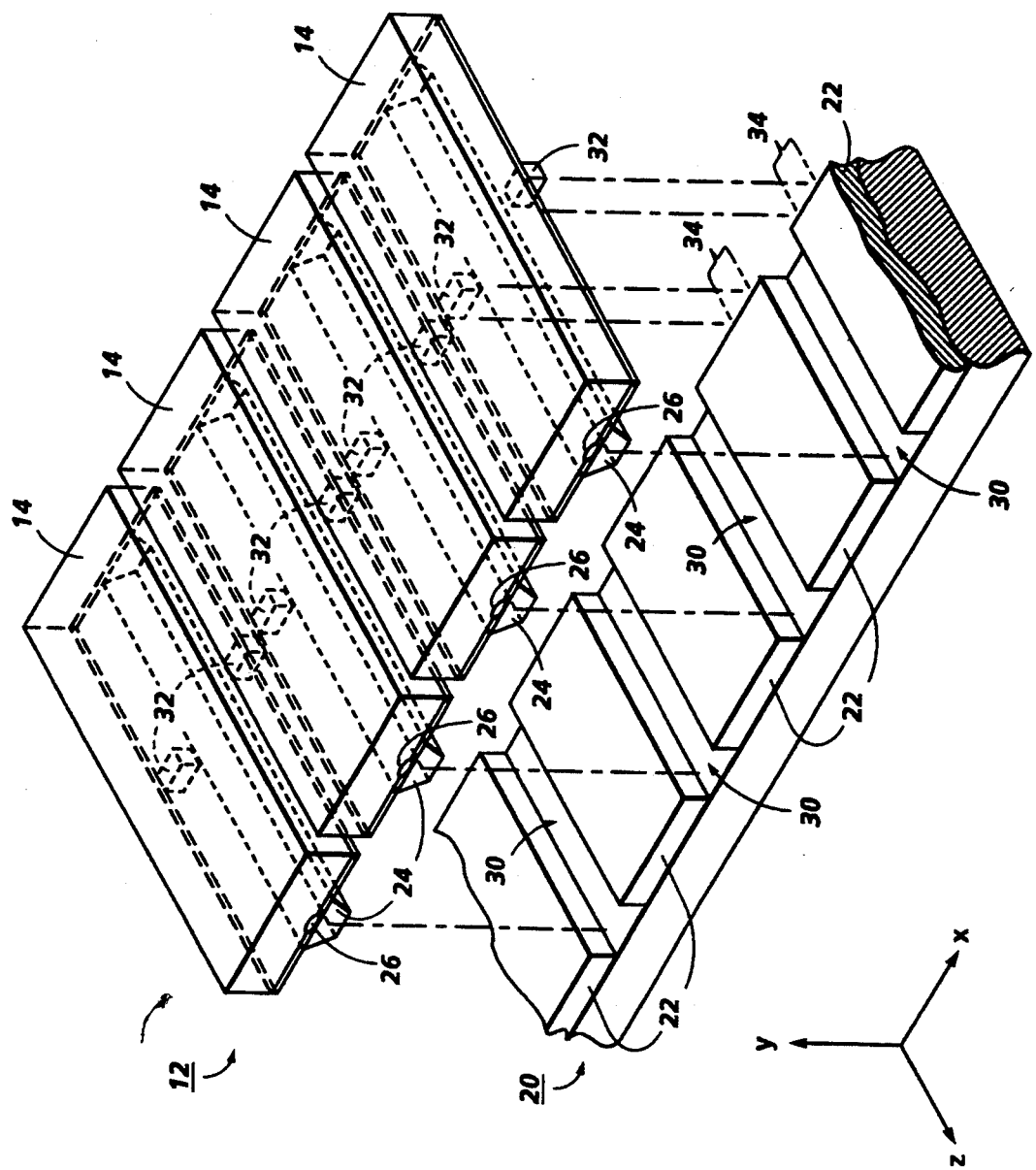
FIG. 1 is a perspective view depicting the assembly of one embodiment of the present invention.

For a general understanding of the method and apparatus used to assemble the multibeam semiconductor laser array of the present invention, reference is made to the drawings. In the drawings, like reference numerals have been used throughout to designate identical elements. For consistency in the following description, the reference directions depicted in FIG. 1 (x, y, and z axes) have been used in a consistent fashion. FIG. 1 shows a perspective view of the manner in which the semiconductor laser array is assembled.

More specifically, FIG. 1 illustrates a multibeam semiconductor laser preferably formed using a novel alignment method which will be described hereafter. Multibeam laser 12 generally includes a plurality of semiconductor laser diodes or dies, 14, which will be permanently affixed to at least one surface of heatsink 20. The laser diodes may be any of the well known laser structures, and are preferably ridge guide lasers which may each exhibit separate wavelength and polarization characteristics for the emitted beam. The ridge guide laser is formed by etching away a portion of a cladding layer (not shown) present on the surface of an epitaxially grown laser wafer, leaving a narrow ridge of the cladding to define the laser lateral waveguide 24. Typically, the ridge or waveguide is formed on the surface of the laser wafer as an approximately 1.0–5.0 µm wide (x-direction) and 0.2–0.5 µm thick (y-direction) structure extending along the entire length of each laser die.

Following a metalization step, which produces a metal surface on a junction side of the laser diodes, the surface being suitable for electrical and thermal contact therewith, the diodes are cleaved from the wafer thereby producing numerous similarly formed diodes. The cleaved diodes typically have lengths of a few hundred microns in the z-direction. Since the waveguide ridge forms the lateral optical confinement structure for the semiconductor laser, the ridge precisely defines the origin of the light emission for the laser, emitter 26. Ridge 24, extending outward in a perpendicular direction from the surface of the laser die, also provides a feature that can be positioned in alignment with a complimentary structure 22, on the surface of heatsink 20, to which the laser is mounted. FIG. 1 shows a partial array of four ridge guide laser diodes being mounted on heatsink 20 wherein the relative positions of the four laser emitters is controlled by complimentary alignment structures 22.

Alignment structures 22 can be positioned on the heatsink photolithographically and therefore the structures can be positioned to photolithographic accuracy, typically in the sub-micron range. As an example, a thermally conductive electrical insulator such as BeO ceramic or silicon would be used for the heatsink. A photoresist layer would be spin coated on the planar surface of the heatsink and patterned using optical lithography to protect contact region 30 and to provide electrical isolation regions between the lasers. Next, a thin layer of metal, on the order of approximately 2 to 3 nanometers in thickness, would be evaporated onto the planar surface of the heatsink. Standard liftoff techniques would then be used to remove the photoresist layer and the overcoating metal layer leaving metal on the unmasked regions where the alignment structures are to be built up. The alignment structures, 22, on the substrate are then built up in thickness upon the patterned metal layer by electroplating with a metal such as gold, to a thickness of approximately 1 $\mu$m.

Once the metal alignment structures are present on the heatsink, photoresist would be used to again mask the electrical isolation regions between the lasers. Metal would then be evaporated onto the substrate so that a metal layer is deposited within contact regions 30 and so that the contact regions will receive solder in a subsequent bonding step. A standard liftoff technique would again be used to remove the photoresist and overcoating metal leaving a break in the metal layer between the bonding regions for each laser. Alternatively, should a single contact to a common anode for all of the lasers be desirable, the metalization layer last deposited over the surface of the heatsink could be continuous. Finally, solder could be electroplated in place, or solder preforms could be used, to enable soldering of each laser in a sequential array assembly operation. Moreover, wire bonds on the top of each laser and on a fanned-out isolation pad associated with each laser (not shown) would result in electrical isolation of each laser.

In yet another alternative, a common anode heatsink with the desired alignment structures could be produced. More specifically, a thermally conductive heatsink substrate such as copper, beryllia (BeO), or silicon could be overcoated with a continuous film of a protective metal such as gold or nickel. Subsequently, the contact region would be protected with a photoresist mask, the alignment structures would be built up to a desired level and the individual laser dies would be joined to the heatsink and associated alignment structures as described above. As before, wirebonding to the individual laser diodes provides the electrical connection to drive the individual lasers and the electrically conductive heatsink surface provides the common anode.

The alignment structures 22 could also be formed on the heatsink using polyimide or an organic thin film. However, it may be preferable to have a higher thermal conductivity material, such as gold, silicon or diamond used to form the structures, thereby providing an excellent heat dissipation path between the laser diode and the heatsink. As yet another alternative, the heatsink may be a malleable material, for example copper, which could be cold formed with integral alignment structures therein by stamping the alignment structures with a metal master. To complete the heatsink preparation in any of the embodiments described above, once the laser diodes are placed in the appropriate locations, eutectic soldering in contact region 30 would permanently affix the diodes to the heatsink, provide efficient heat dissipation for the individual lasers, and assure continued alignment of the array.

Figure 2:
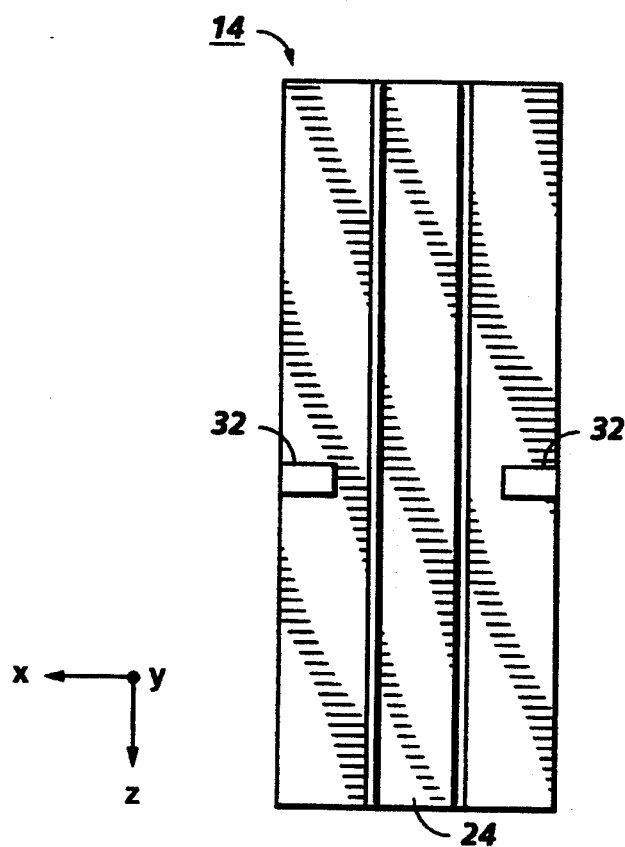
FIG. 2 is a planar view illustrating the lower surface of a laser diode depicted in FIG. 1.

The bottom view of a laser diode, depicted in FIG. 2, displays an additional feature of the present invention, the use of a secondary alignment feature 32 to control the z-direction position of the laser diode. Such secondary alignment features may be formed at the same time as the waveguide ridge is being formed, simply by allowing the cladding layer to be left in additional areas on the surface of the laser. As illustrated in FIG. 1, the secondary features could then be used upon assembly of the laser diodes and the heatsink to provide a positive stop which would control the position of the laser diodes in the z-direction. More specifically, the secondary alignment features, 32, would be positioned so as to abut a back side or edge of alignment structure 22 at the positions indicated by reference numeral 34.

Alternatively, alignment features 32 may be formed on the metalized surface of the wafer, photolithographically using "windows" produced in a photoresist masking layer which would control the location and dimensions of the alignment features. Furthermore, such alignment features could be complementary structures similar to those described in copending U.S. patent application No. 08/057,799, patent pending by Andrews et al., hereby incorporated by reference for its teachings, which would mate with complimentary features (not shown) on alignment structures 22, thus making it easier to achieve the desired interlocking between laser diodes 14 and the alignment structures present on the surface of heatsink 20.

Figure 3:
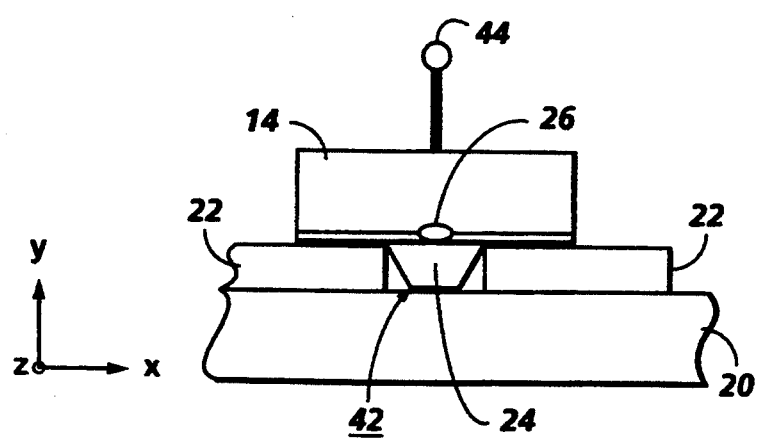
FIGS. 3, 4 and 5 are elevational views showing alternative embodiments for the alignment features and laser waveguide ridges of the present invention.
Figure 4:
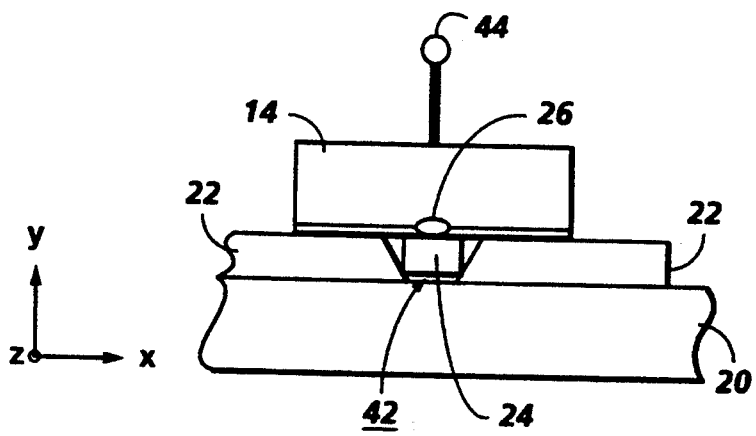
Figure 5:
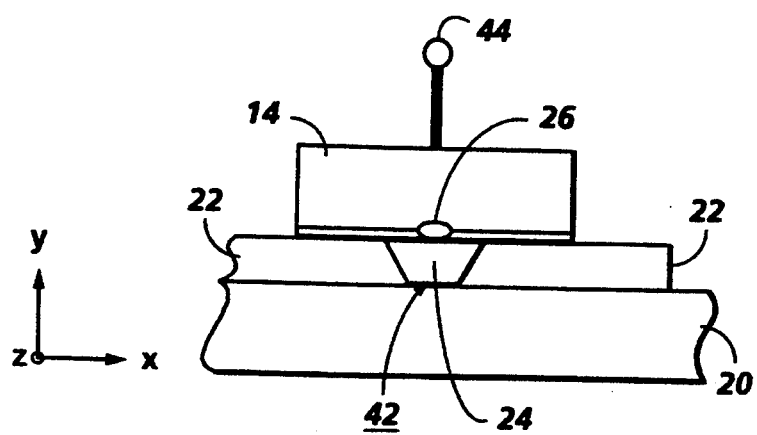

Although FIGS. 1 and 2 depict a laser diode having a ridge waveguide with sloped walls and an alignment structure with vertical walls, the embodiments depicted in FIGS. 3, 4 and 5 are intended to illustrate other alternative yet desirable configurations. Referring now to FIGS. 3, 4, and 5, the particular geometry of the mating alignment structures will, to a large extent, depend on the means used to create the structures. For example, chemical etching of the alignment structure material tends to form sloped walls whereas ion beam etching tends to create straight walls. In addition, ion beam etching can create walls with a controlled slope. Though crystal specific selective etches can be used to an advantage to obtain a desired etch profile, they are not essential for forming either the ridge structures on the epitaxial laser materials or the mounting structures on the heatsink.

FIGS. 3, 4, and 5 show alternative alignment structure and waveguide embodiments using a combination of straight and sloping contacts. More specifically, FIG. 3 illustrates a laser die 14 having a sloped wall waveguide. The lateral, or x-direction, position of the diode and its associated emitter 24 are controlled by contact with the upper edges of the straight walled alignment structures 22. As previously described, the assembly may employ a thin solder layer at the location indicated by reference numeral 42, the interface between the ridge waveguide and the lowermost plane of the heatsink. Preferably, there would also be a solder joint between the uppermost surface of the alignment structures and the planar surfaces of the laser diodes. Also depicted is an electrical contact, 44, which is connected to the upper or substrate side of the laser diode. A second contact with the lower or junction side of the laser diode is accomplished via heatsink 20 which provides a common contact to all diodes fixed thereon. In the situation where separate electrical connections are to be established for each laser diode, to avoid the necessity of making electrical connections in regions having limited clearance (i.e., areas where wirebonding would be impractical), electrical fanout contacts can be provided for a number of lasers, with the top surfaces of the laser diodes providing the common contact. For example, such electrical fanouts could be produced at about the same time that the upper surfaces of alignment structures 22 are metalized and patterned as previously described. While the structures illustrated in FIG. 3 may result in a more positive x-axis alignment, they could add a small uncertainty on the order of 0.1 μm to 0.3 μm to the y-axis position of the emitter relative to a desired x-z reference plane (not shown).

FIGS. 4 and 5 show the two sloped alignment structure wall configurations. FIG. 4, however, depicts a vertical wall waveguide 24, where the lateral alignment of the laser diode 14 is controlled by the abutment of the edges of the waveguide with the sloped walls of the alignment structures 20. Again, as in the previous embodiment, a solder layer could be used to fill any gap in the region indicated by reference numeral 42, thereby providing thermal and electrical contact with the laser diode. With respect to FIG. 5, both the waveguide 24 and the alignment structures 22 employ sloped walls. As further indicated in FIG. 5, this configuration also achieves maximum surface contact between the laser diode and the alignment structure/heatsink combination. It is further contemplated that other surface features formed as a result of various production process used for laser diodes may be employed as alignment features. For example, a ridge or waveguide laser may be produced wherein the lateral waveguide is defined by a pair of parallel grooves etched into the wafer surface on either side of the laser stripe. The previously described alignment structures 22, present on heatsink 20, could be similarly modified so as to include parallel edges with which linear contact to surfaces within the etched grooves may be established, thereby providing the desired alignment between adjacent lasers.

In all of the above embodiments, the front edge of the heatsink could be used as the alignment reference point for the out of plane (z-direction) alignment. However, the secondary alignment features described with respect to FIGS. 1 and 2 can be created to insure both lateral (x-axis) and out of plane (z-axis) alignment. It is also noted that since the x-axis alignment is the most critical in determining the interbeam spacing of the laser array in the image plane, positional accuracy in this direction should not be sacrificed. The minimum spacing achievable with the described embodiments is determined by the ability to break, cleave, or dice narrow laser diode chips and by the ability to handle and assemble such chips with vacuum chucks and other types of manipulators used in assembly of the array 12 of FIG. 1. Conceivably, interlaser spacings less than or equal to about 100 μm should be achievable using this type of alignment, with a spacing tolerance of approximately ±1% over an array of four or more lasers.

In recapitulation, the present invention is a method and apparatus for fabricating a multiple beam semiconductor laser array, wherein the laser array includes a plurality of semiconductor laser dies affixed in a linear fashion to a supporting heatsink. Accurate interlaser spacing is achieved by utilizing alignment structures formed on the mounting surface of the heatsink. Once assembled, the alignment structures are in an abutting relationship with the ridge waveguides present on each of the semiconductor lasers. The method not only enables the accurate placement of the laser diodes relative to one another so as to reduce interlaser spacing error, but also eliminates the need for multiple-step alignment operations to produce the multiple diode laser array.

It is, therefore, apparent that there has been provided, in accordance with the present invention, a method and apparatus for accurately positioning a plurality of laser dies on the surface of a heatsink to produce a multiple diode laser array. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

I claim:

1. A multiple diode laser array comprising:
   a heatsink having a generally planar surface;
   a plurality of laser diodes, each of said plurality of laser diodes including a wafer having a series of epitaxially grown layers deposited upon a surface thereof to form an emitter, and a ridge-shaped waveguide defining the position of the emitter; and
   alignment means, disposed at preset intervals along the planar surface of said heatsink and adapted to associate with the waveguides of said plurality of laser diodes, for controlling the spacing of said laser diodes with respect to one another to assure accurate spacing of the emitters therein.

2. The multiple diode laser array of claim 1, wherein said alignment means comprise a plurality of spaced members protruding from the planar surface of said heatsink so as to form substantially parallel recesses therebetween, each of said recesses being adapted to receive one of the ridge-shaped waveguides of said laser diodes.

3. The multiple diode laser array of claim 2, wherein each of said plurality of members comprises a polyimide layer deposited on the surface of said heatsink.

4. The multiple diode laser array of claim 2, wherein each of said plurality of members comprises an organic thin film deposited on the surface of said heatsink.

5. The multiple diode laser array of claim 2, wherein each of said plurality of members comprises a metallic layer deposited on the surface of said heatsink.

6. The multiple diode laser array of claim 2, wherein each of said plurality of members comprises a layer of high thermal conductivity material deposited on the surface of said heatsink.

7. The multiple diode laser array of claim 6, wherein said layer of high thermal conductivity material is selected from the group consisting of:
   gold;
   silicon; and
   diamond.

8. The multiple diode laser array of claim 1, wherein said ridge-shaped waveguide comprises a narrow cladding layer formed over a portion of the surface of said epitaxial layers.

9. The multiple diode laser array of claim 8, wherein said cladding layer ranges from about 1 μm to less than 5 μm in width, said cladding layer having a thickness ranging from about 0.2 μm to less than 0.5 μm.

10. The multiple diode laser array of claim 1, further comprising a layer of solder interposed between at least a portion of said heatsink and said laser diodes.

11. The multiple diode laser array of claim 1, wherein:
   said plurality of laser diodes includes a first laser diode and a second laser diode; and said first laser diode emits a radiant energy beam having a first wavelength and said second laser diode emits a radiant energy beam having a second wavelength which differs from said first wavelength.

12. The multiple diode laser array of claim 1, wherein:

said plurality of laser diodes includes a first laser diode and a second laser diode; and said first laser diode emits a radiant energy beam having a first polarity and said second laser diode emits a radiant energy beam having a second polarity which differs from said first polarity.

13. A plurality of single diode lasers with each including a ridge-shaped wafer portion having a series of epitaxially layers forming a p-n junction emitter, and a waveguide present on the surface of the wafer to define the position of the emitter, said diode lasers being assembled adjacent one another to provide a multiple diode laser array, comprising:

a heatsink including a generally planar surface;

alignment means, disposed along the planar surface of said heatsink, for controlling the location of said diode lasers, said alignment means being adapted to remain in an abutting relationship with the waveguides of the diode lasers so as to maintain a predetermined spacing between the emitters of adjacent diode lasers; and means for permanently affixing the diode lasers to the heatsink.

14. The multiple diode laser array of claim 13, wherein said alignment means comprise a plurality of members protruding from the planar surface of said heatsink to form substantially parallel recesses therebetween with the recesses being adapted to receive the ridge-shaped waveguides of said diode lasers so as to maintain the predetermined emitter spacing between adjacent diode lasers.

15. The multiple diode laser array of claim 14, wherein each of said plurality of members comprises a polyimide layer deposited on the surface of said heatsink.

16. The multiple diode laser array of claim 14, wherein each of said plurality of members comprises an organic thin film deposited on the surface of said heatsink.

17. The multiple diode laser array of claim 14, wherein each of said plurality of members comprises a layer of high thermal conductivity material deposited on the surface of said heatsink.

18. The multiple diode laser array of claim 17, wherein said layer of high thermal conductivity material is selected from the group consisting of:
gold;
silicon; and
diamond.

19. The multiple diode laser array of claim 14, wherein:

said heatsink is a malleable material; and said plurality of members comprise cold formed members on said heatsink.

20. A method of fabricating an array of multiple laser diodes, each laser diode having a raised waveguide on a surface thereof which defines the location of light emitting regions thereon, comprising the steps of:

forming a plurality of spaced alignment members on a surface of a heatsink to form substantially parallel elongated recesses therebetween;

placing the lasers on said heatsink so as to maintain the laser diodes in a predetermined spaced-apart arrangement by an abutting contact region between a surface of the raised waveguide and a surface of the alignment member; and permanently affixing the laser diodes to said heatsink.

21. The method of claim 20, wherein said affixing step comprises the step of applying solder to a region between said heatsink and the laser diode.

22. The method of claim 20, wherein said forming step includes:

depositing a polyimide layer on the surface of the heatsink; and selectively etching the polyimide layer to remove portions thereof to create the elongated recesses.

23. The method of claim 20, wherein said forming step includes:

depositing an organic thin film on the surface of the heatsink; and selectively etching the organic thin film to remove portions thereof to create the elongated recesses.

24. The method of claim 20, wherein said forming step includes:

depositing a layer of high thermal conductivity material on the surface of the heatsink; and selectively etching the layer of high thermal conductivity material to remove portions thereof to create the elongated recesses.

25. The method of claim 20, wherein said forming step includes:

depositing a photoresist layer on the surface of the heatsink;

patterning the photoresist layer;

evaporating a layer of metal onto the surface of the heatsink;

removing the photoresist layer and the overcoating metal layer thereon to leave metal on unmasked regions of the heatsink surface where the alignment members are to be located; and increasing the thickness of the metal layer present on the surface of the heatsink to produce alignment members having a predetermined thickness.

26. The method of claim 20, wherein said heatsink is a malleable material and where said forming step includes cold forming said heatsink to create the elongated recesses therein.

* * * * *